United States Patent [19]
Mizutani et al.

[11] Patent Number: 5,478,972
[45] Date of Patent: Dec. 26, 1995

[54] MULTILAYER CIRCUIT BOARD AND A METHOD FOR FABRICATING THE SAME

[75] Inventors: Daisuke Mizutani; Kishio Yokouchi, both of Kawasaki, Japan

[73] Assignee: Fujitsu Limited, Kanagawa, Japan

[21] Appl. No.: 295,461

[22] Filed: Aug. 25, 1994

[30] Foreign Application Priority Data

Sep. 8, 1993 [JP] Japan ................................ 5-223226

[51] Int. Cl.$^6$ ........................................ H05K 1/00
[52] U.S. Cl. .................. 174/250; 174/258; 174/261; 174/263; 174/264; 361/791
[58] Field of Search ................................ 174/250, 256, 174/258, 261, 262, 264, 263; 361/784, 785, 790, 791, 792

[56] References Cited

U.S. PATENT DOCUMENTS

| | | |
|---|---|---|
| 4,997,689 | 3/1991 | Langen et al. . |
| 5,081,070 | 1/1992 | Yokoyama et al. . |
| 5,119,535 | 6/1992 | Gnagy et al. . |

FOREIGN PATENT DOCUMENTS

| | | |
|---|---|---|
| 62-230093 | 10/1987 | Japan . |
| 3-112187 | 5/1991 | Japan . |

*Primary Examiner*—Morris H. Nimmo
*Assistant Examiner*—Cheryl R. Figlin
*Attorney, Agent, or Firm*—Armstrong, Westerman, Hattori, McLeland & Naughton

[57] ABSTRACT

An interlayer connection wiring penetrating each of resin films constituting a multilayer circuit board and a surface wiring connected to the interlayer connection wiring are formed in predetermined positions on surfaces of each resin film. The resin films are laminated while being positioned so that the interlayer connection wiring of one of each adjacent pair of the circuit bases is superposed on a part of the surface wiring of the other, and are thereafter treated under a high-temperature and high-pressure condition to be combined with each other. If a resin film formed of a thermoplastic resin is adopted, the laminated resin films are combined by intermixing the interfaces of each adjacent pair of resin films. As the resin films shrink when the laminated resin films is cooled to ordinary temperature, a compressive force is applied to the contact surfaces of the interlayer connection wiring and the surface wiring. A resin block in which metal wires disposed parallel to each other are embedded is sliced perpendicularly to the metal wires to form resin films each having interlayer connection wiring elements with projections formed on opposite end portions of each wiring element. The projections are utilized to ensure reliable connections between the interlayer connection wiring of one of each adjacent pair of resin films and the surface wiring formed on the other.

11 Claims, 4 Drawing Sheets

MULTILAYER CIRCUIT BOARD AND A METHOD FOR FABRICATING THE SAME

BACKGROUND OF THE INVENTION

1. Field of the Invention

This invention relates to a multilayer circuit board having a structure in which a plurality of resin film layers each formed with an interlayer connection wiring and a surface wiring are laminated, and to a method of fabricating the multilayer circuit board.

2. Description of Related Art

Recently, with the increase in the integration density of semiconductor integrated circuits, multilayer circuit boards for forming high-density integrated circuits thereon with finer circuit patterns have been developed. With respect to such multilayer circuit boards, high circuit connection reliability is required while there is a strong demand for a reduction in the period of order-delivery time.

To form finer circuit patterns, a multilayer circuit board comprising a plurality of resin films is used. Via holes are formed in each of the resin films by using a lithography technique, an interlayer connection wiring element is formed in each via hole, and a surface wiring element connected to the interlayer connection wiring element is formed on a surface of each resin film. This process is repeated to obtain a multilayer circuit board. This conventional process for fabricating a multilayer circuit board will be described in more detail.

Referring to FIG. 1A, (in step (a)) surface wiring elements $101_1$ are formed on a surface of a resin film $100_1$. The surface wiring elements $101_1$ are formed by etching a foil attached to the surface of the resin film $100_1$ or a metal film deposited by a well-known thin film technique such as sputtering. Next, (in step (b)) a precursor of polyimide, for example, is applied to the surface of the resin film $100_1$ and is cured to form a layer-insulation film $100_2$ having a thickness of 10 to 20 µm. Thereafter, (in step (c)) via holes 102 having a diameter of 20 to 50 µm are formed in the layer-insulation film $100_2$ at predetermined positions. A portion of each of the surface wiring elements $101_1$ is exposed in corresponding via holes 102. Ordinarily, the via holes 102 are formed by, for example, a well-known lithography technique.

Thereafter (in step (d)), as shown in FIG. 1B, interlayer connection wiring elements 103 made of, for example, copper (Cu) are formed on inner walls of the via holes 102. The interlayer connection wiring elements 103 are connected to the surface wiring elements $101_1$ exposed in the via holes 102. Subsequently, (in step (e)) surface wiring elements $101_2$ are formed of copper (Cu) on the surface of the layer-insulation film $100_2$. The surface wiring elements $101_2$ are connected to the interlayer connection wiring elements 103. The surface wiring elements $101_1$ and $101_2$ are connected to each other through the interlayer connection wiring elements 103. If the surface wiring elements $101_2$ are comparatively thick, the internal spaces of the via holes 102 are filled with the material of the surface wiring elements $101_2$. The interlayer connection wiring elements 103 and the surface wiring elements $101_2$ may be formed by a well-known thin film technique such as vacuum deposition or sputtering and a well-known lithography technique including a lift-off technique.

The steps (b) to (e) are repeated to fabricate a multilayer circuit board having a desired number of layers.

The above-described conventional method of fabricating a multilayer circuit board formed of resin films requires many fabrication days. To make one layer of circuit base by the above-described steps (b) to (e), three days, on average, are required. That is, fifteen days are required to complete a multilayer circuit board formed of five layers of circuit bases. In such a case, it is possible that an urgent demand for a design change with respect to a portion of the multilayer circuit board cannot be satisfied. There is, therefore, a need to reduce the time taken to fabricate the above-described multilayer circuit board formed of resin films.

SUMMARY OF THE INVENTION

It is therefore an object of the present invention to provide a means for reducing the time taken to fabricate a multilayer circuit board formed of resin films.

Another object of the present invention is to provide a means for improving the reliability of interlayer connection of wiring in a multilayer circuit board formed of resin films.

According to the present invention, there is provided a method of fabricating a multilayer circuit board, comprising the steps of making a plurality of circuit bases each having a layer-insulation film formed of a resin, an interlayer connection wiring penetrating the layer insulation film, and a surface wiring connected to the interlayer connection wiring and extending on a surface of the layer-insulation film, laminating the plurality of circuit bases while positioning the same so that the interlayer connection wiring of one of each adjacent pair of the circuit bases is superposed on a part of the surface wiring of the other of the adjacent pair of the circuit bases, and treating the plurality of laminated circuit bases at a predetermined temperature and a predetermined pressure to combine the circuit bases.

According to this fabrication method, the circuit bases to be laminated can be fabricated concurrently with respect to the positions of their respective interlayer connection wiring elements and patterns of the surface wiring connected to the interlayer connection wiring elements. Accordingly, the number of days for fabricating the multilayer circuit board is the sum of the number of days required to form the circuit bases and the number of days required to combine the circuit bases in a superposed state, which can be much smaller than fifteen, the number of days required by the conventional art. Further, since the process of making each circuit base includes no steps for applying a resin precursor and curing the same, such as step (b) of the conventional fabrication method, the number of days required to make the circuit boards can be reduced from three, the number of days required by the conventional method, to two or less. Thus, according to the present invention, it is substantially possible to limit the number of days necessary for the entire process to about two or three, even if the number of layers of the multilayer circuit board is increased.

In the above-described method, a thermoplastic resin may be selected as the resin forming each layer-insulation film, and a plurality of layer-insulation films each having the interlayer connection wiring and the surface wiring are laminated and treated at a predetermined temperature and a predetermined pressure.

By this treatment, the interfaces of each adjacent pair of the layer-insulation films are mutually fused to combine the films. There is no need to interpose an adhesive layer between the interfaces of the layer-insulation films. Also, a compressive force acts between the interlayer connection wiring and the surface wiring element respectively formed in and on each adjacent pair of layer-insulation films by shrinkage of the layer-insulation films caused when the temperature thereof is reduced to ordinary temperature after the high-temperature treatment. Good electrical connections are thereby established between the wirings.

In the above-described method, each layer-insulation film having the interlayer connection wiring with opposite end projections may be made in such a manner that a single or a plurality of metal wires parallel to each other are disposed in positions corresponding to interlayer connection wiring elements and embedded in a resin in a fluidized state, the resin in which the metal wires are embedded is solidified and is sliced perpendicularly to the metal wires.

Alternatively, each layer-insulation film having the interlayer connection wiring with opposite end projections may be made in such a manner that a single or a plurality of through holes extending parallel to each other are formed in a block formed of a resin at positions corresponding to inter layer connection wiring elements of the circuit base, a metal wire is inserted in each through hole, and the resin block with the inserted metal wires is sliced perpendicularly to the metal wires.

The opposite end projections of the interlayer connection wiring have an effect of ensuring reliable contact with the corresponding surface wiring.

As the resin of the block, a thermoplastic resin may be selected and the metal wire may be inserted in each through hole while the resin block formed of the thermoplastic resin is being heated at a temperature where the resin shows glass transition.

According to this fabrication method, the metal wires from which the interlayer connection wiring is formed can be firmly supported in the layer-insulation film by the effect of shrinkage of the thermoplastic resin when the thermoplastic resin block with the inserted metal wires is cooled to ordinary temperature.

The multilayer circuit board in accordance with the present invention is constructed in such a manner that a plurality of circuit bases each having a resin film, an interlayer connection wiring penetrating the resin film and a surface wiring extending on a surface of the resin film are superposed, and the surface wiring provided on the surface of one of each adjacent pair of resin films and the interlayer connection wiring penetrating the other are connected in a compressed state.

In this construction, the surface wiring patterns of the superposed circuit bases can be connected to each other with improved reliability without using soldering, thermocompression bonding or the like.

The multilayer circuit board in accordance with the present invention may also be constructed in such a manner that a plurality of circuit bases each having a thermoplastic resin film, an interlayer connection wiring penetrating the resin film and a surface wiring extending on a surface of the resin film are superposed, and each adjacent pair of thermoplastic resin films are mutually fused at their interfaces.

In this construction, the superposed circuit bases are combined with each other without using an adhesive therebetween. The fabrication process is therefore simplified and a reduction in mutual connection reliability caused by application of an adhesive between the contact interfaces of the interlayer connection wiring and the surface wiring can be avoided.

DESCRIPTION OF THE PREFERRED EMBODIMENTS

First Embodiment

Figure 1A:
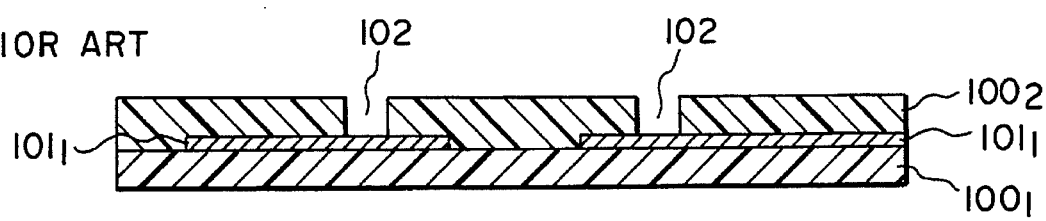
FIGS. 1A and 1B are cross-sectional view of members for forming a multilayer circuit board formed of resin films by a conventional fabrication method.
Figure 1B:
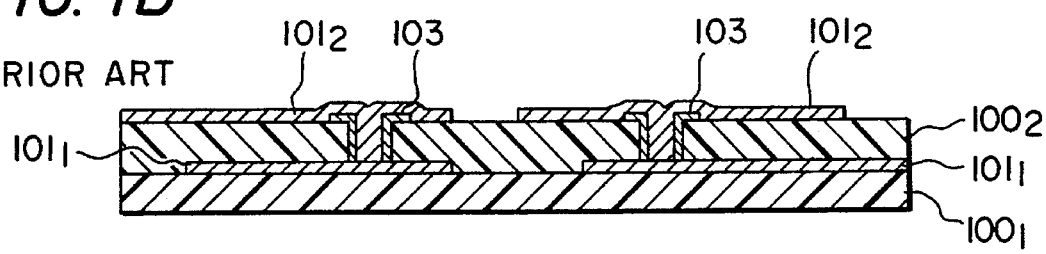
Figure 2:
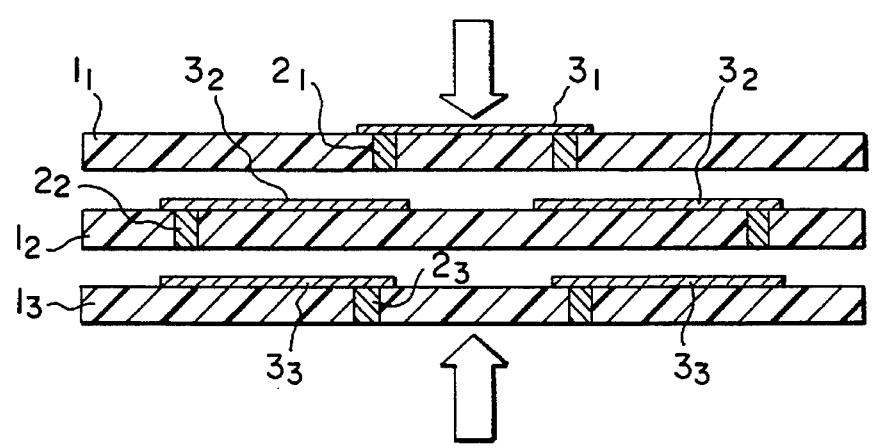
FIG. 2 is a cross-sectional view of a first embodiment of the present invention, showing an example of the structure of a multilayer circuit board formed of resin films and an example of a fabrication method.

FIG. 2 is a cross-sectional view of a first embodiment of the present invention, illustrating an example of the structure of a multilayer circuit board formed of resin films and an example of a method of fabricating the multilayer circuit board.

In FIG. 2, reference characters $1_1$, $1_2$, and $1_3$ designate resin films, reference characters $2_1$, $2_2$, and $2_3$ designate interlayer connection wiring elements formed through the resin films $1_1 1_2$, and $1_3$ in the direction of thickness of the same, and reference characters $3_1$, $3_2$, and $3_3$ designate surface wiring patterns respectively connected to the interlayer connection wiring elements $2_1$, $2_2$, and $2_3$ and extending on surfaces of the resin films $1_1$, $1_2$, and $1_3$.

Interlayer connection wiring elements $2_1$ and surface wiring patterns $3_1$ are formed on the first-layer resin film $1_1$. Interlayer connection wiring elements $2_2$ and surface wiring patterns $3_2$ are formed on the second-layer resin film $1_2$. Interlayer connection wiring elements $2_3$ and surface wiring patterns $3_3$ are formed on the third-layer resin film $1_3$. Each of the resin films $1_1$, $1_2$, and $1_3$ has a thickness of, for example, 10 to 20 μm. As resin films $1_1$, $1_2$, and $1_3$, a film of a well-known heat resisting resin such as polyimide or epoxy resin may be used. The present invention is best characterized by using a film of a thermoplastic resin as resin films $1_1$, $1_2$, and $1_3$, as mentioned later. For example, as a thermoplastic resin for resin films $1_1$, $1_2$, and $1_3$, a resin formed by partially introducing a three-dimensional crosslinked structure into polyolefin, cyclic polyolefin, polyphenylene ether or the like is suited, as mentioned later. Such a resin has a large temperature difference between its glass transition point and its melting point and therefore facilitates a control of temperature and pressure in a lamination process described below.

As interlayer connection wiring elements $2_1$, $2_2$, and $2_3$ and surface wiring patterns $3_1$, $3_2$, and $3_3$, a thin film of copper, aluminum or an alloy of these metals is suited. Such a thin film may be formed by using a well-known vacuum deposition or sputtering technique. Such a thin film may be patterned to form the desired interlayer connection wiring or surface wiring by using a well-known lithography technique.

These resin films $1_1$, $1_2$, and $1_3$ are laminated after being positioned relative to each other so that the interlayer connection wiring elements of one of each adjacent pair of resin films are superposed on predetermined portions of the surface wiring patterns of the other resin film. For example, referring to FIG. 2, the resin films are positioned so that the interlayer connection wiring elements $2_1$ of the first-layer resin film $1_1$ are superposed on portions of the surface wiring patterns $3_2$ of the second-layer resin film $1_2$, and so that the interlayer connection wiring elements $2_2$ of the second-layer resin film $1_2$ are superposed on portions of the surface wiring patterns $3_3$ of the third-layer resin film $1_3$.

If these resin films $1_1$, $1_2$, and $1_3$ are formed of a thermoplastic resin, the laminated resin films $1_1$, $1_2$, and $1_3$ are heated under the application of a pressure F and at a temperature at which glass transition takes place in these films. After heating, ordinary-temperature and ordinary-pressure conditions are restored. By this high-temperature and high-pressure treatment, the laminated resin films $1_1$, $1_2$, and $1_3$ are connected so that their contact interfaces are intermixed. The laminated resin films $1_1$, $1_2$, and $1_3$ are combined with each other in this manner.

As mentioned above, a resin formed by partially introducing a three-dimensional crosslinked structure into polyolefin, cyclic polyolefin, polyphenylene ether or the like has such a characteristic that the difference between the temperature at which it exhibits a thermoplasticity and the softening temperature at which it exhibits high flowability at a certain pressure is large. Such a thermoplastic resin can be used more advantageously in comparison with other resins the corresponding temperature difference of which is smaller, because the high-temperature and high-pressure treatment for laminated resin films of such a large-temperature difference thermoplastic resin can be controlled more easily.

In general, the resin films $1_1$, $1_2$, and $1_3$ have a thermal expansion coefficient about one place larger than that of metals such as copper, aluminum and the like. Accordingly, the resin films $1_1$, $1_2$, and $1_3$ combined in the above-described manner exhibit a shrinkage rate higher than that of the interlayer connection wiring elements $2_1$, $2_2$, and $2_3$ when the temperature thereof is reduced to ordinary temperature from the heating temperature. Therefore, a compressive force acts upon the contact interfaces of interlayer connection wiring elements $2_1$ and surface wiring patterns $3_2$ and the contact interfaces of interlayer connection wiring elements $2_2$ and surface wiring patterns $3_3$. A good electrical connection is thereby established therebetween. If a layer of gold is formed at least on the surface of the contact portions of the interlayer connection wiring elements $2_1$, $2_2$, and $2_3$ and the surface wiring patterns $3_1$, $3_2$, and $3_3$, an electrical connection is established by alloying caused at the contact interfaces of these wiring elements during the above-described high-temperature treatment.

In the above-described process, respective operations of making resin films $1_1$, $1_2$, and $1_3$ which have corresponding interlayer connection wiring elements $2_1$, $2_2$, and $2_3$ and surface wiring patterns $3_1$, $3_2$, and $3_3$ can be performed in parallel with each other. Consequently, the number of days for fabricating the multilayer circuit board of the present invention is the sum of the number of days required to form the resin films having the corresponding interlayer connection wiring and surface wiring, and the number of days required to combine the resin films.

Second Embodiment

Figure 3A:
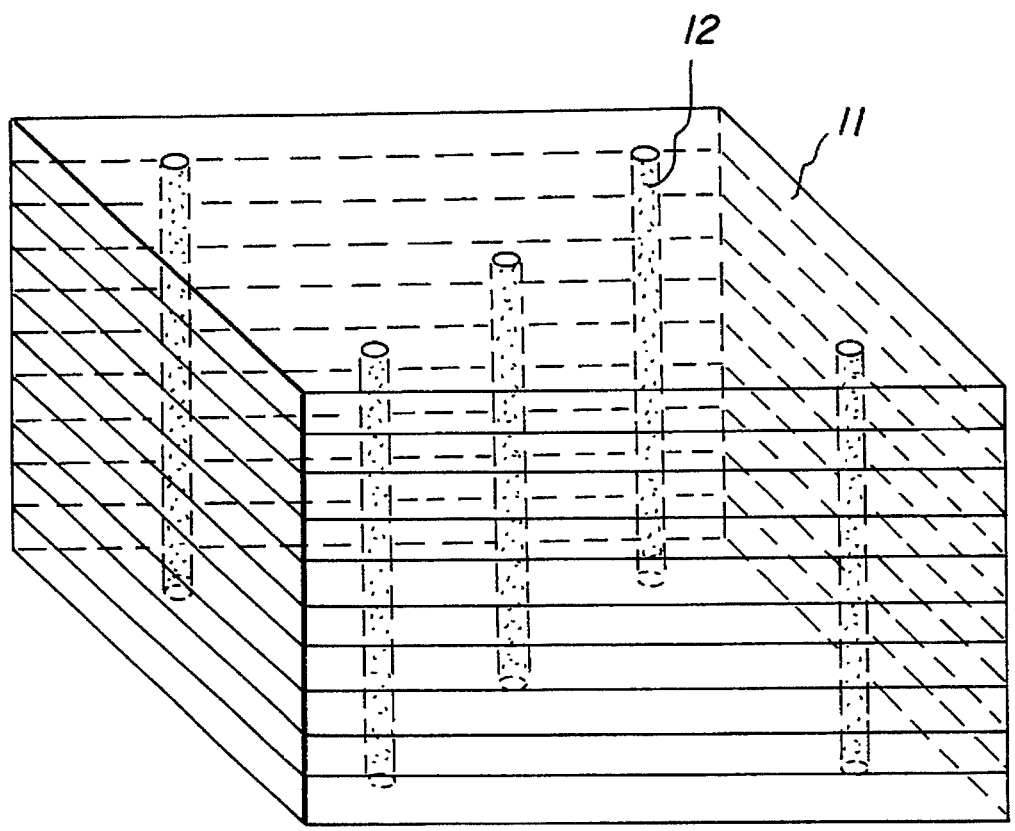
FIGS. 3A and 3B are a perspective view and a cross-sectional view, respectively, of a second embodiment of the present invention, showing another method for fabricating a multilayer circuit board formed of resin films.
Figure 3B:
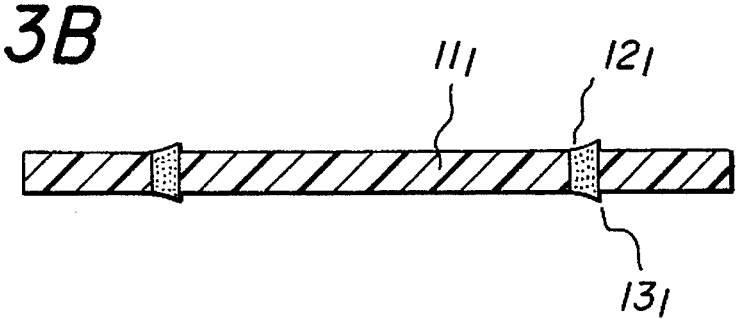

FIGS. 3A and 3B are a perspective view and a cross-sectional view, respectively, for explaining another fabrication method of a multilayer circuit board formed of a plurality of resin films according to the present invention.

In FIGS. 3A and 3B are illustrated a resin block 11, metal wires 12, layer-insulation film $11_1$ formed by slicing the resin block 11, and interlayer connection wiring elements $12_1$ formed by cutting metal wires 12. A resin film formed in accordance with this embodiment can be used to fabricate the multilayer circuit board described above with respect to the first embodiment.

Referring to FIG. 3A, metal wires 12, e.g., copper wires having a diameter of 50 µm, are disposed in parallel with each other, for example, at positions corresponding to the interlayer connection wiring elements $2_1$ illustrated in FIG. 2. These metal wires 12 are maintained in a state of being tensioned with a supporting jig (not shown). These metal wires 12 are embedded in the resin block 11 formed of a thermoplastic resin, e.g., polyolefin or the like. A process step for embedding the metal wires 12 may be such that a thermoplastic resin fluidized by heating is cast around the metal wires 12 supported as described above, and is thereafter cooled to solidify.

The solidified resin block 11 is sliced perpendicularly to the metal wires 12 with a predetermined pitch of, for example, 30 µm in the direction of thickness to obtain resin film $11_1$ shown in FIG. 3B, with interlayer connection wiring elements $12_1$ formed from metal wires 12. Predetermined surface electrodes are formed on a surface of each resin film $11_1$ made in this manner and having interlayer connection wiring elements $12_1$.

A certain number of resin blocks 11 in which metal wires 12 are embedded as described above are prepared in correspondence with the arrangement of the interlayer connection wirings in each of the resin films constituting a multilayer circuit board, and are worked into films. Thereafter, desired surface wiring patterns are formed on the films. In this manner, resin films $1_1$, $1_2$, and $1_3$ of the first embodiment, for example, are obtained.

According to the method of the second embodiment, by the effect of the difference between the thermal expansion coefficients of the metal and the resin described above, interlayer connection wiring elements $12_1$ are firmly supported in the resin film $11_1$ without using a special means.

in the above-described process, resin block 11 formed of a thermoplastic resin is prepared. However, resin block 11 may be made in such a manner that metal wires 12 are embedded in a resin before polymerization, and the resin is thereafter heated to form resin block 11 in a fully or partially polymerized state. If resin films made by slicing resin block 11 in a partially polymerized state are laminated, polymerization is promoted by a high-temperature and high-pressure treatment, thereby enabling the films to be combined without interposing a special means such as an adhesive layer, as in the case of films formed of a thermoplastic resin. If resin films made by slicing sufficiently polymerized resin block 11 are laminated, they may be combined with each other by using an adhesive or a solvent.

Figure 4A:
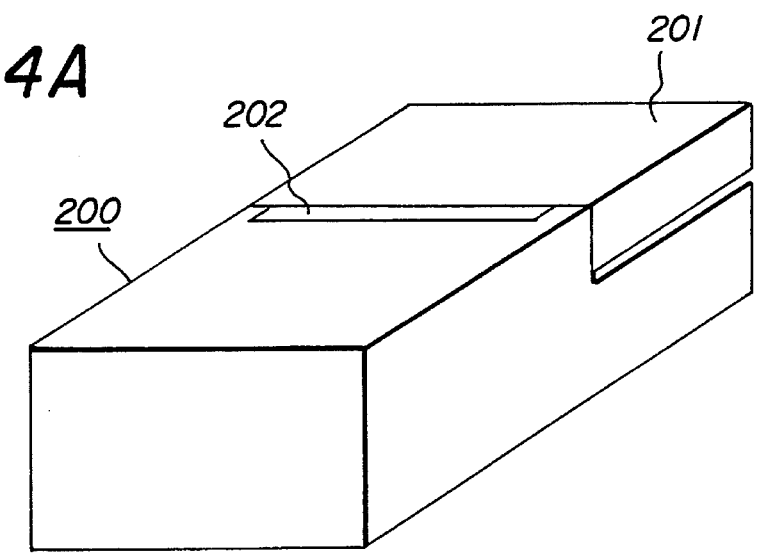
FIGS. 4A and 4B are a perspective view and a partially enlarged side view, respectively, of a machine for making resin films used in the second and third embodiments of the present invention.
Figure 4B:
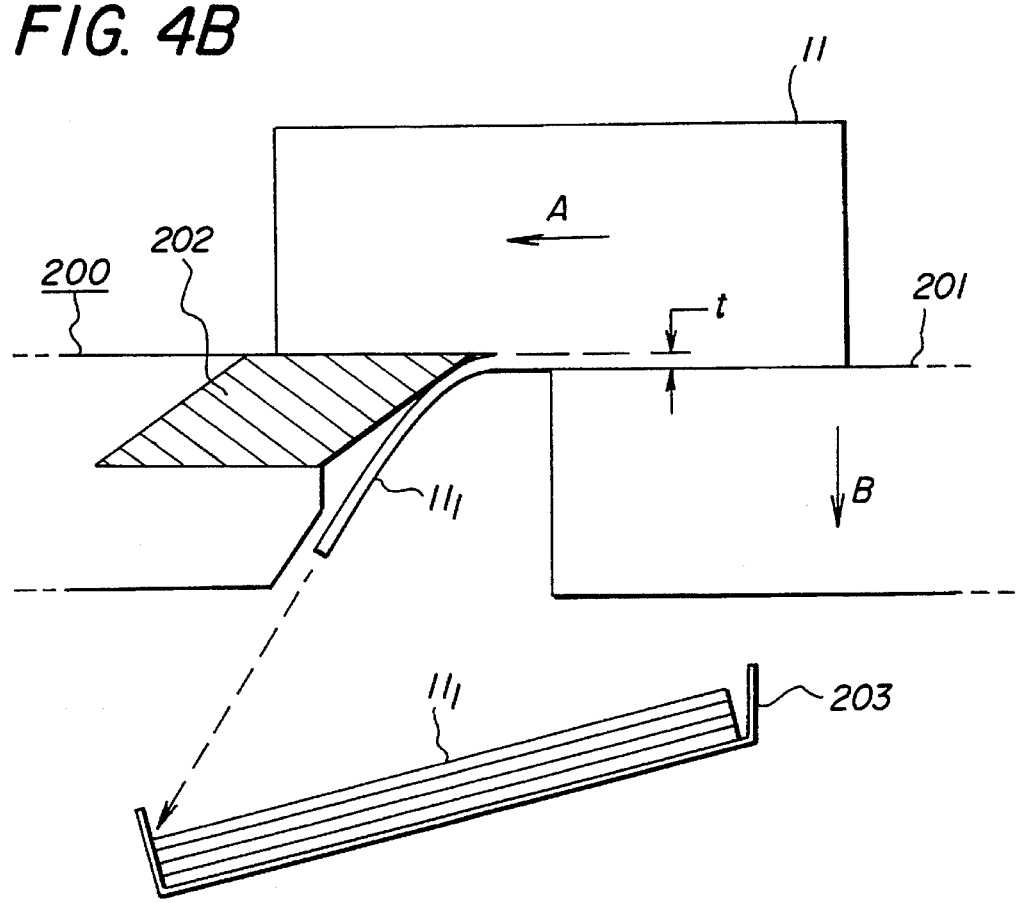

FIGS. 4A and 4B are a perspective view and a partially-enlarged side view of the entire structure of a working machine for slicing resin block 11 formed of a thermoplastic or any other kind of resin as described above into resin films $11_1$ having a predetermined thickness. As shown in FIG. 4A, the machine 200 has a stage 201 movable in a vertical direction with a precision of ±1 µm, and a blade 202 fixed on the machine in such a position that its one surface is flush with an upper surface of the machine 200. For example, the blade 202 is driven so as to vibrate parallel to the upper surface of the stage 201 by an ultrasonic vibration mechanism (not shown). As the ultrasonic vibration mechanism, US 15 polymer marketed by Minitor Co. Ltd., Japan, can be used, for example.

The resin block 11 shown in FIG. 3A is first placed on the stage 201, and the height of the stage 201 is adjusted so that the upper surface of stage 201 is lower than the upper surface of the machine 200 by a value equal to the desired thickness t of resin film $11_1$. Next, referring to FIG. 4B, the resin block 11 is moved in the direction of arrow A. By this movement, the resin block 11 is sliced to form resin film $11_1$ having thickness t. When the resin block 11 is moved in the direction of arrow A through a distance corresponding to its length, the resin film $11_1$ separates from the resin block 11 and falls to be received by a tray 203.

The resin block 11 is returned to the initial position on the stage 201, and the stage 201 is lowered by a distance t in the direction of arrow B. Subsequently, the operation of moving the resin block 11 in the direction of arrow A to slice off resin film $11_1$ is repeated.

In resin film $11_1$ made by slicing a surface portion of resin block 11, such as that shown in FIG. 3A, in which metal wires 12 are embedded, by using the machine described above with reference to FIGS. 4A and 4B, interlayer connection wiring elements $12_1$ formed by portions of the metal wires 12 extend through the thickness of resin film $11_1$. Projections $13_1$ are formed on the opposite ends of each interlayer connection wiring element $12_1$ so as to protrude beyond the surfaces of resin film $11_1$.

If resin films $11_1$ having such interlayer connection wiring elements $12_1$ are laminated and combined under a pressurized condition, projections $13_1$ of each resin film $11_1$ are brought into contact with surface wiring patterns formed on one adjacent resin film $11_1$ in such a manner as to cut into the surface wiring patterns, thereby establishing good connections. The surface of resin film $11_1$ made by the above-described method is smooth enough to form surface wiring patterns (not shown) thereon. Accordingly, it is not necessary to perform surface polishing, which may remove projections $13_1$ formed on the opposite ends of interlayer connection wiring elements $12_1$. Only a surface cleansing treatment for removing contaminants will suffice.

Japanese Patent Laid-Open Publication Nos. 62-230093 and 3-112187 disclose methods of fabricating a circuit board by casting a resin around metal wires disposed in positions corresponding to interlayer connection wiring elements, as in the case of the above-described second embodiment. The former discloses a method of using a diamond cutter or a laser cutter to cut a resin in which metal wires are embedded. The latter discloses a method of disposing metal wires in a cavity defined with a spacer corresponding to a desired board thickness, and casting a resin in the cavity. The prior art disclosed in each publication comprises no method of slicing a resin block into films having a thickness of about 30 µm with a kind of plane as in the second embodiment of the present invention. This is because these prior arts are intended to form a comparatively thick circuit board formed of a single layer. Accordingly, there have been disclosed no multilayer circuit board fabricated by laminating and combining resin films $11_1$ formed by slicing resin block 11 as in the case of the present invention and no method for fabricating a multilayer circuit board in this manner. In particular, there has been disclosed no method of laminating a plurality of layers of resin film $11_1$ formed of a thermoplastic resin and combining these layers under a high-temperature and high-pressure condition. Also, there has been disclosed no method of utilizing projections $13_1$ on the opposite ends of interlayer connection wiring elements $12_1$ embedded in resin film $11_1$ for connection to interlayer connection wiring $12_1$ on one of adjacent resin films $11_1$ and for connection to a surface wiring on the other of the adjacent resin films $11_1$.

Third Embodiment

Figure 5:
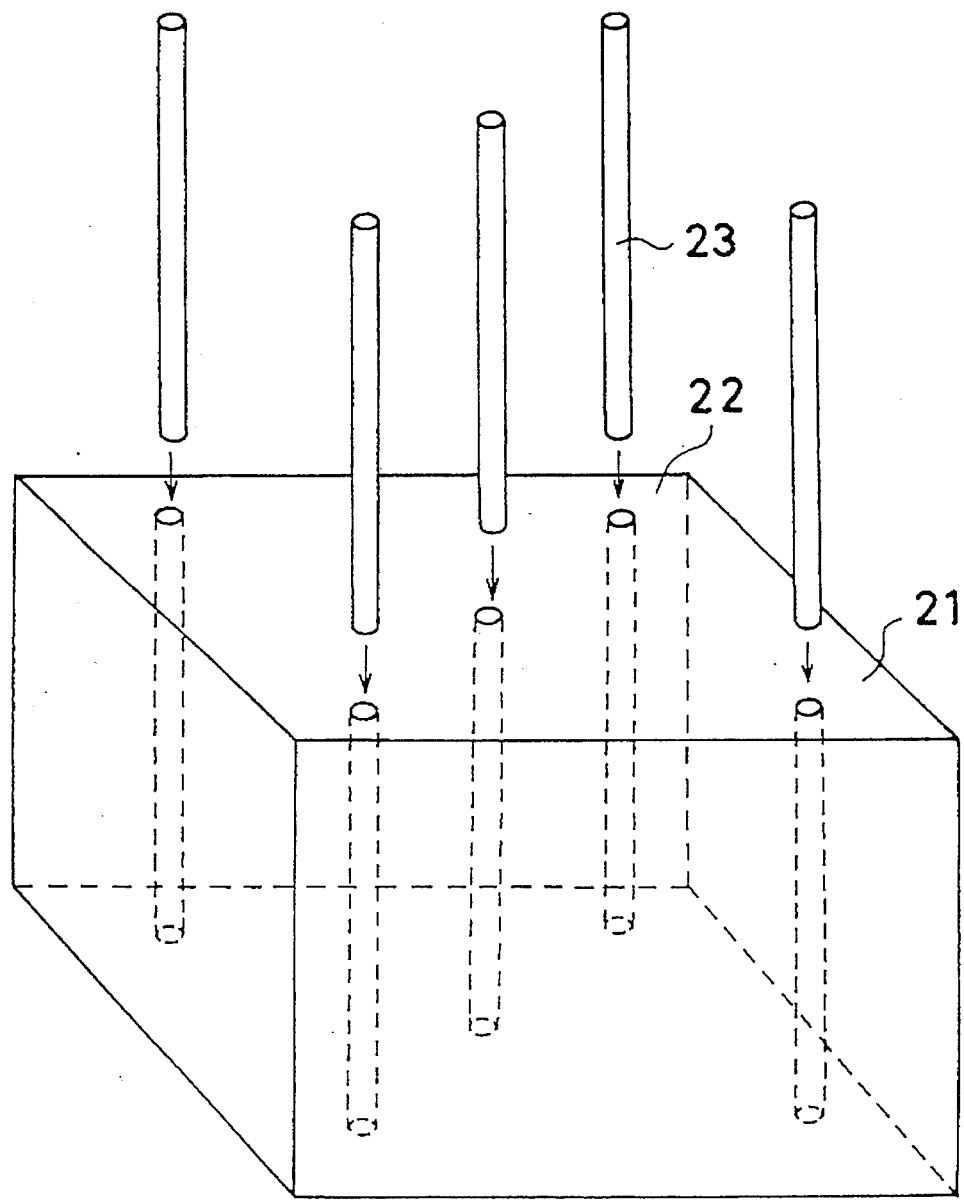
FIG. 5 is a perspective view of the third embodiment of the present invention, showing a further method for fabricating a multilayer circuit board formed of resin films.

FIG. 5 is a perspective view of members from which a multilayer circuit board formed of resin films is formed by a further fabrication method of the present invention.

In FIG. 3 are illustrated a resin block 21 formed of a thermoplastic resin, holes 22, and metal wires 23. A resin film formed in accordance with this embodiment and having interlayer connection wiring elements can be used to fabricate the multilayer circuit board formed of resin films described above with respect to the first embodiment.

In this embodiment, in the resin block 21 formed of a thermoplastic resin and having a sufficient thickness, holes 22 are formed, for example, at positions corresponding to interlayer connection wiring elements 21 in the resin film 11 shown in FIG. 2. The resin block 21 is heated at a temperature equal to or slightly higher than its glass transition point. In this state, metal wires 23 for forming interlayer connection wiring elements are press-fitted in the holes 22. The resin block 21 is thereafter cooled.

The resin block 21 in which the metal wires 23 are inserted is sliced perpendicularly to the metal wires 23 with a predetermined pitch of, for example, 30 µm in the direction of thickness by using the same machine as in the second embodiment to obtain a resin film having interlayer connection wiring elements formed of metal 23. Predetermined surface electrodes are formed on a surface of the resin film made in this manner and having interlayer connection wiring elements. The thus-obtained resin film can be used in the method of fabricating the resin film multilayer circuit board of the first embodiment.

The method in accordance with the third embodiment also ensures that the interlayer connection wiring elements can be firmly supported in the resin film without using a special means, by the effect of the difference between the thermal expansion coefficients of the metal and the resin described above. In the process step of slicing the resin block into films having a predetermined thickness, projections are also formed on the opposite ends of each interlayer connection wiring element embedded in each resin film so as to protrude beyond the surfaces of the resin film, as in the case of the second embodiment. If resin films having such interlayer connection wiring elements are laminated and combined under a pressurized condition, projections of each resin film are brought into contact with surface wiring patterns formed on one adjacent resin film in such a manner as to cut into the surface wiring patterns, thereby establishing good connections.

Resin block 21 can also be formed by using a thermosetting resin, such as a polyimide or epoxy resin. In such a case, an adhesive is used to fix metal wires 23 in holes 22 formed in the resin block 21. When resin films made by slicing the resin block 21 perpendicularly to the metal wires 23 are laminated, a solvent or an adhesive is applied to necessary portions of each adjacent pair of resin films to combine the resin films.

According to the present invention, as described above, resin films to be laminated can be made in parallel with each other in the process of fabricating a multilayer circuit board formed of resin films. Also, if resin films formed of a thermoplastic resin are used, resin films to be laminated can be combined without using a special means such as an adhesive layer. These features ensure that the fabrication process can be simplified and the number of fabrication days can be reduced. Also, the reliability of electrical connections between each adjacent pair of resin films in the multilayer structure can be improved.

What is claimed is:

1. A multilayer circuit board comprising a lamination of a plurality of circuit bases, each circuit base comprising:

a layer-insulation film formed of a resin having a first coefficient of thermal expansion;

an interlayer connection wiring extending through said layer-insulation film, said interlayer connection wiring being formed of a metal having a second coefficient of thermal expansion smaller than said first coefficient of thermal expansion; and surface wiring extending on at least one surface of said layer-insulation film and connected to said interlayer connection wiring, wherein, in said lamination, said interlayer connection wiring of one of each adjacent pair of said circuit bases and said surface wiring of the other of the adjacent pair of said circuit bases are in contact with each other by a force generated in accordance with the difference between the first coefficient of thermal expansion of said resin and the second coefficient of thermal expansion of said metal when said lamination is cooled down from a temperature at which said circuit bases have been combined into a single body under an application of a pressure.

2. A multilayer layer circuit board according to claim 1, wherein said layer insulation film is formed of a thermoplastic resin, and each adjacent pair of the layer-insulation films in said lamination of the circuit bases are mutually bonded without any adhesive agent intervening therebetween.

3. A method of fabricating a multilayer circuit board, comprising the steps of:

making a plurality of circuit bases each comprising a layer-insulation film formed of a resin having a first coefficient of thermal expansion, an interlayer connection wiring extending through the layer-insulation film, said interlayer connection wiring being formed of a metal having a second coefficient of thermal expansion smaller than said first coefficient of thermal expansion and a surface wiring extending on a surface of said layer-insulation film and connected to the interlayer connection wiring;

laminating the plurality of circuit bases so that the interlayer connection wiring of one of each adjacent pair of the circuit bases is superposed on a part of the surface wiring of the other of the adjacent pair of the circuit bases; and subjecting the plurality of laminated said circuit bases to a heat treatment at a predetermined temperature and a predetermined pressure so that the laminated said circuit bases are combined into a single body and the interlayer wiring of one of each adjacent pair of the circuit bases and the part of the surface wiring of the other of the adjacent pair of the circuit bases are in contact bases are in contact with each other.

4. A multilayer circuit board according to claim 2, wherein the thermoplastic resin is one of polyolefin, cyclic polyolefin and polyphenylene ether.

5. A method according to claim 3, wherein said resin is a thermoplastic resin and said predetermined temperature is a temperature where glass transition takes place in said thermoplastic resin, whereby each adjacent pair of the layer-insulation films in said lamination of the circuit bases are bonded without any adhesive agent intervening therebetween.

6. A method according to claim 3, further comprising the steps of:

embedding in each block of a resin at least one metal wire extending in a direction and being arranged so as to correspond to the interlayer connection wiring of one of the circuit bases;

slicing off a surface of the block of the resin together with the metal wire embedded therein by using a plane to form a surface, the surface being perpendicular to the direction in which the metal wire extends in the block of the resin, thereby forming the layer-insulation film having the interlayer connection wiring formed from the metal wire and having projections formed on opposite ends thereof; and forming the surface wiring extending on one surface of the layer-insulation film in which the interlayer connection wiring is formed, the surface wiring being connected to the interlayer connection wiring.

7. A method according to claim 6, wherein each said block of resin is formed of a thermoplastic resin, and the step of embedding the metal wire in the bock is performed such that the thermoplastic resin block is heated at a temperature where glass transition takes place therein and inserting the metal wire in the heated block, thereafter cooling the block to ordinary temperature.

8. A method according to claim 3, further comprising the steps of:

forming at least one through hole in a block of a resin, the through hole being arranged so as to correspond to the interlayer connection wiring of one of the circuit bases;

inserting a metal wire in the through hole;

slicing off a surface of the block of the resin together with the metal wire embedded therein by using a plane to form a surface, the surface being perpendicular to the metal wire embedded in the block of the resin, thereby forming the layer-insulation film having the interlayer connection wiring formed from the metal wire and having projections formed on opposite ends thereof; and forming the surface wiring extending on one surface of the layer-insulation film in which the interlayer connection wiring is formed, the surface wiring being connected to the interlayer connection wiring.

9. A method according to claim 8, wherein each said block of resin is formed of a thermoplastic resin, and the step of embedding the metal wire in the bock is performed such that the thermoplastic resin block is heated at a temperature where glass transition takes place therein and inserting the metal wire in the trough hole of the heated block, thereafter cooling the bock to ordinary temperature.

10. A method according to claim 5, 7 or 9, wherein one of polyolefin, cyclic polyolefin and polyphenylene ether is selected as the thermoplastic resin.

11. A method according to claim 6 or 8, further comprising the step of finishing surfaces of the layer insulation film formed by slicing the block and the metal wire in such a manner that the projections on the opposite end portions of the interlayer connection wiring remain after the finishing.

* * * * *